United States Patent
Ren et al.

(10) Patent No.: US 10,185,192 B2
(45) Date of Patent: Jan. 22, 2019

(54) THIN FILM TRANSISTOR ARRAY SUBSTRATE, METHOD FOR MANUFACTURING THE SAME AND METHOD FOR MAINTAINING THE SAME, AND DISPLAY PANEL

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Xingfeng Ren, Beijing (CN); Chong Fang, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 15/120,347

(22) PCT Filed: Jan. 21, 2016

(86) PCT No.: PCT/CN2016/071613
§ 371 (c)(1),
(2) Date: Aug. 19, 2016

(87) PCT Pub. No.: WO2017/012320
PCT Pub. Date: Jan. 26, 2017

(65) Prior Publication Data
US 2017/0153523 A1    Jun. 1, 2017

(30) Foreign Application Priority Data
Jul. 22, 2015  (CN) .......................... 2015 1 0437816

(51) Int. Cl.
*H01L 27/12*    (2006.01)
*G02F 1/1362*   (2006.01)
(Continued)

(52) U.S. Cl.
CPC ...... *G02F 1/136286* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS 9,129,923 B1 * 9/2015 Han .................... H01L 27/3248
9,508,753 B2 * 11/2016 Murakami ........ G02F 1/136259
(Continued)

FOREIGN PATENT DOCUMENTS

CN      1808253 A      7/2006
CN    101000412 A      7/2007
(Continued)

OTHER PUBLICATIONS

First Office Action for Chinese Application No. 201510437816.5, dated Apr. 26, 2017, 6 Pages.
(Continued)

*Primary Examiner* — Benjamin Sandvik
(74) *Attorney, Agent, or Firm* — Brooks Kushman P.C.

(57) ABSTRACT

The present disclosure discloses a Thin Film Transistor array substrate, a method for manufacturing the same and a method for maintaining the same, and a display panel. The TFT array substrate includes: a substrate; gate lines, common electrode lines and data lines arranged on the substrate; and pixel electrodes arranged at pixel unit regions defined by the gate lines and the data lines. The TFT array substrate further includes weld metal electrically connected to the
(Continued)

pixel electrodes. Projections of the weld metal onto the substrate and projections of target wires onto the substrate are overlapped at overlapping regions, and the target wires are the gate lines or the common electrode lines.

20 Claims, 5 Drawing Sheets

(51) Int. Cl.
*G02F 1/1343* (2006.01)
*G02F 1/1368* (2006.01)
(52) U.S. Cl.
CPC .. *G02F 1/134309* (2013.01); *G02F 1/136227* (2013.01); *H01L 27/124* (2013.01); *H01L 27/1222* (2013.01); *H01L 27/1262* (2013.01); *G02F 2001/136295* (2013.01); *G02F 2201/123* (2013.01)

(56) References Cited

U.S. PATENT DOCUMENTS

| | | | |
|---|---|---|---|
| 2006/0158596 A1 | 7/2006 | Yoshinaga | |
| 2007/0182441 A1* | 8/2007 | Hwang | G09G 3/3648 345/204 |
| 2009/0015746 A1* | 1/2009 | Te-Chen | G02F 1/136259 349/42 |
| 2009/0152552 A1* | 6/2009 | Ku | G02F 1/136213 257/59 |
| 2011/0183478 A1* | 7/2011 | Chung | H01L 21/28008 438/158 |
| 2013/0215354 A1* | 8/2013 | Yoon | G02F 1/1309 349/46 |
| 2015/0311227 A1* | 10/2015 | Moriwaki | G02F 1/134363 257/43 |
| 2017/0153523 A1 | 6/2017 | Ren et al. | |

FOREIGN PATENT DOCUMENTS

| | | |
|---|---|---|
| CN | 101105582 A | 1/2008 |
| CN | 102315227 A | 1/2012 |
| CN | 103135303 A | 6/2013 |
| CN | 104991385 A | 10/2015 |
| JP | H08328035 A | 12/1996 |
| KR | 20040026859 A | 4/2004 |

OTHER PUBLICATIONS

International Search Report and Written Opinion for Application No. PCT/CN2016/071613, dated Apr. 27, 2016, 11 Pages.
Second Office Action for Chinese Application No. 201510437816.5, dated Jan. 17, 2018, 4 Pages.

* cited by examiner

THIN FILM TRANSISTOR ARRAY SUBSTRATE, METHOD FOR MANUFACTURING THE SAME AND METHOD FOR MAINTAINING THE SAME, AND DISPLAY PANEL

CROSS-REFERENCE TO RELATED APPLICATION

This application is the U.S. national phase of PCT Application No. PCT/CN2016/071613 filed on Jan. 21, 2016, which claims priority to Chinese patent application No. 201510437816.5 filed on Jul. 22, 2015, which is incorporated herein by reference in its entirety.

TECHNICAL FIELD

The present disclosure relates to the field of display technology, and in particular to a Thin Film Transistor (TFT) array substrate, a method for manufacturing the same and a method for maintaining the same, and a display panel.

BACKGROUND

In the process of producing a TFT array substrate, TFT switch damage issues may occur, resulting in pixel light spots.

Pixel light spots may be maintained by a pixel spot darkening, so as to improve product yield. First, electrical connections between drains and pixel electrodes are broken off by cutting the drains; thereafter, the pixel electrodes are welded with gate lines or common electrode lines, so that the pixel electrodes are electrically connected with the gate lines or with the common electrode lines, thereby achieving the purpose of darkening pixel spots.

In the process of implementing the present disclosure, the inventor has found that the related art at least has the following issues: since pixel electrodes are usually made of ITO (Indium-Tin Oxide) material while ITO material is brittle, ITO cracks easily occur during welding the pixel electrodes with the gate lines or with the common electrode lines, resulting in a low welding success rate and a large probability of maintenance failure.

SUMMARY

In order to solve the problem in the prior art that, when pixel light spots are maintained in a pixel spot darkening way, welding the pixel electrodes with the gate lines or with the common electrode lines results in a low success rate and a large probability of maintenance failure, the present disclosure provides in some embodiments a TFT array substrate, a display panel, a manufacturing method and a maintaining method. The technical solution is as follows.

In a first aspect, there is provided a TFT array substrate, including: a substrate; gate lines, common electrode lines and data lines arranged on the substrate; and pixel electrodes arranged at pixel unit regions defined by the gate lines and the data lines. The TFT array substrate further includes weld metal electrically connected to the pixel electrodes. Projections of the weld metal onto the substrate and projections of target wires onto the substrate are overlapped at overlapping regions, and the target wires are the gate lines or the common electrode lines.

Alternatively, the pixel electrodes are electrically connected to the weld metal through via holes.

Alternatively, the via holes are circular holes each being of a diameter in a range from 6 μm to 15 μm; or the via holes are square holes each being of a length of side in a range from 6 μm to 15 μm.

Alternatively, the pixel electrodes are directly lapped to the weld metal.

Alternatively, the weld metal and the data lines are in the same layer.

Alternatively, each of the target wires includes a strip-like wire body and a weld portion electrically connected to the wire body. The projections of the weld metal onto the substrate and projections of the weld portions onto the substrate are overlapped at the overlapping regions.

Alternatively, the weld portion is of a length in a range from 6 μm to 18 μm and a width in a range from 3 μm to 5 μm.

Alternatively, all or a part of each of the overlapping regions is arranged outside a connection projection region. The connection projection region is a projection region of a connection region, in which each of the pixel electrodes is electrically connected to the weld metal, onto the substrate.

Alternatively, all or a part of each of the overlapping regions is arranged outside a projection region of the corresponding pixel electrode onto the substrate.

Alternatively, the weld metal is of a length in a range from 6 μm to 18 μm, a width in a range from 3 μm to 5 μm and a thickness in a range from 1 μm to 3 μm.

Alternatively, the overlapping region is of a width in a range from 2 μm to 8 μm and a length in a range from 3 μm to 18 μm.

In a second aspect, a display panel is provided, including the TFT array substrate as described in the first aspect.

In a third aspect, a method for manufacturing a TFT array substrate is provided, including: forming, on a substrate, gate lines, common electrode lines, data lines, pixel electrodes and weld metal electrically connected to the pixel electrodes. The pixel electrodes are arranged at pixel unit regions defined by the gate lines and the data lines, projections of the weld metal onto the substrate and projections of target wires onto the substrate are overlapped at overlapping regions, and the target wires are the gate lines or the common electrode lines.

In a fourth aspect, a method for maintaining the TFT array substrate as recited in the first aspect is provided, including: cutting drain electrodes of the data lines, so as to break electrical connections between the drain electrodes and the pixel electrodes; and welding at the overlapping regions, so as to electrically connect the weld metal to the target wires.

Alternatively, the step of welding at the overlapping regions includes: welding at a portion of each of the overlapping regions outside the corresponding connection projection region. The connection projection region is a projection region of a connection region, in which each of the pixel electrodes is electrically connected to the weld metal, onto the substrate.

Alternatively, the step of welding at the overlapping regions includes: welding at a portion of each of the overlapping regions outside the projection region of the corresponding pixel electrode onto the substrate.

Alternatively, the gate lines and the common electrode lines are arranged at the same layer.

Alternatively, a welding point at each of the overlapping regions is arranged at a portion of the overlapping region outside the corresponding connection projection region.

Alternatively, the welding point at each of the overlapping regions is arranged at a portion of the overlapping region outside the projection region of the corresponding pixel electrode onto the substrate.

According to the technical solution in some embodiments of the present disclosure, a weld metal electrically connected with pixel electrodes is formed, and the projections of the weld metal onto the substrate and the projections of the target wires onto the substrate are overlapped at the overlapping regions. Thus, when pixel light spots are maintained in a pixel spot darkening way, the overlapping region is welded, so that electrical connections are formed between the weld metal and the target wires. The problem is addressed that ITO cracks occur during directly welding the pixel electrodes with the gate lines or the common electrode lines in the related art, resulting in a low success rate and a large probability of maintenance failure. Transforming the welding between metal and ITO to the welding between metal to metal is realized, effectively reducing the occurrence of ITO cracks, improving the welding success rate, and thus improving the maintenance success rate of TFT array substrate.

BRIEF DESCRIPTION OF THE DRAWINGS

In order to illustrate the technical solution in some embodiments of the present disclosure more clearly, the drawings to be used in the description of the embodiments will be described below simply. Apparently, the drawings in the following description are merely for some embodiments of the present disclosure. Those of ordinary skill in the art also may obtain other drawings from these drawings, without creative efforts.

DETAILED DESCRIPTION OF THE EMBODIMENTS

To make the purpose, technical solution and advantages of the present disclosure clearer, the embodiments of the present disclosure will be described hereinafter further in detail in conjunction with the drawings.

Figure 1:
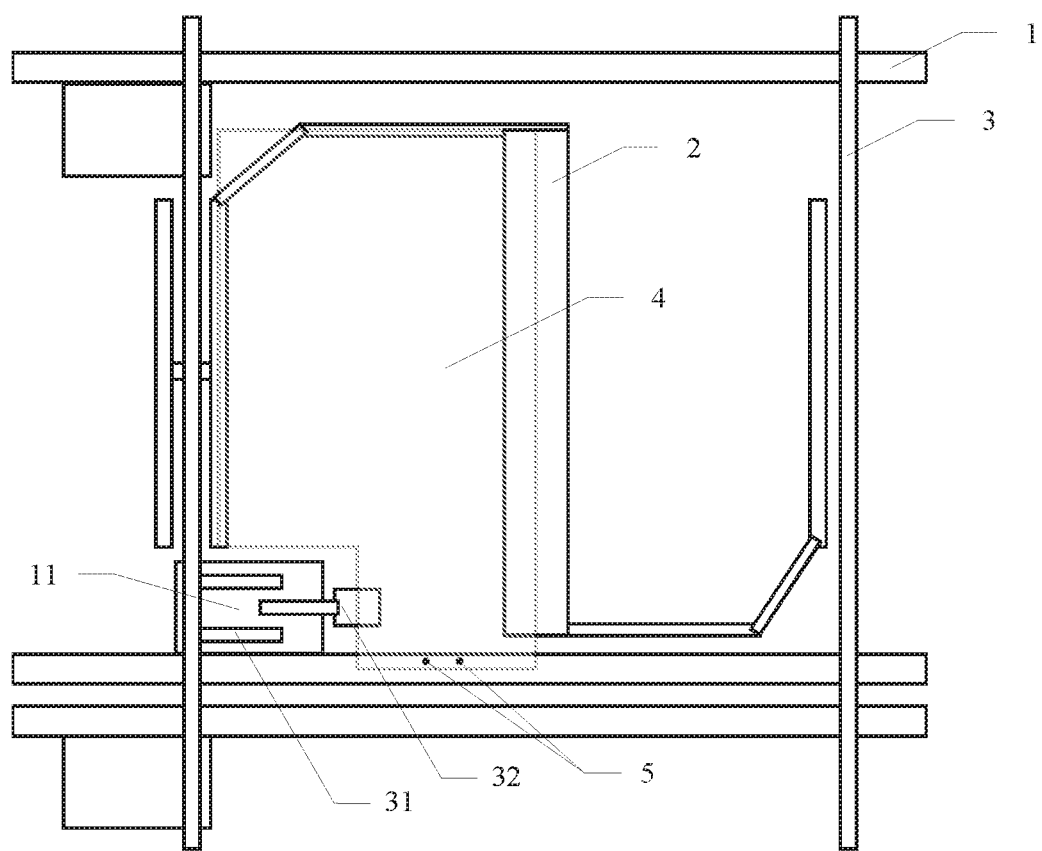
FIG. 1 is a schematic view of a TFT array substrate in the related art.

Before some embodiments of the present disclosure are introduced and described, the TFT array substrates in the related art and methods for maintaining the same will first be briefly introduced. Referring to FIG. 1, which illustrates a schematic structural diagram of a TFT array substrate in the related art. FIG. 1 only shows a part of the TFT array substrate, and those skilled in the art may appreciate that the TFT array substrate includes a plurality of the parts as shown in FIG. 1, but will be described here only taking this part as an example.

As shown in FIG. 1, the TFT array substrate includes: a substrate (not shown); gate lines 1, common electrode lines 2 and data lines 3 arranged on the substrate; and pixel electrodes 4 arranged at pixel unit regions defined by the gate lines 1 and the data lines 3. Each of the gate lines 1 includes a gate electrode 11, and each of the data lines 3 includes a source electrode 31 and a drain electrode 32. The gate electrode 11, the source electrode 31 and the drain 32 electrode constitute a thin film transistor.

Display panels including a TFT array substrate are divided into two different types, normally white mode and normally black mode. As for TFT switch damage issues, when pixel light spots are maintained by a pixel spot darkening, for a display panel in the normally white mode, it is required to weld pixel electrodes to gate lines, while for a display panel in the normally black mode, it is required to weld pixel electrodes to common electrode lines. As shown in FIG. 1, taking welding pixel electrodes to gate lines as an example, a welding may be performed at a welding point 5 by a laser welding, and metal materials of the gate lines 1 will be melt and then connected to the pixel electrodes 4, so that the pixel electrodes 4 are connected electrically to the gate lines 1. Since the pixel electrodes are made of ITO material while ITO material is brittle, ITO is easy to be cracked during the welding of the metal with ITO.

Figure 2:
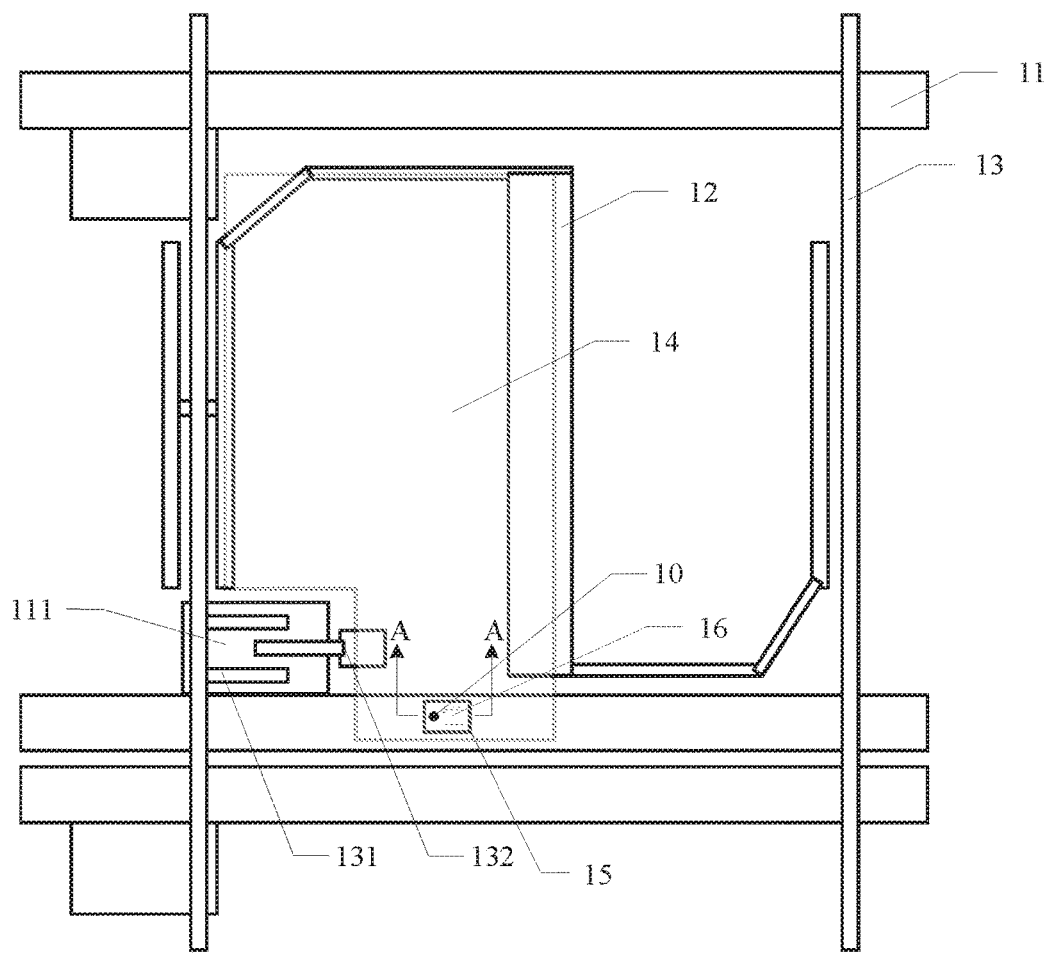
FIG. 2 is a schematic view of a TFT array substrate in some embodiments of the present disclosure.

Referring to FIG. 2 which is a schematic view of a TFT array substrate in some embodiments of the present disclosure. FIG. 2 only shows a part of the TFT array substrate, and those skilled in the art may appreciate that the TFT array substrate includes a plurality of the parts as shown in FIG. 2, and will be described here taking this part as an example.

As shown in FIG. 2, the TFT array substrate includes: a substrate (not shown); gate lines 11, common electrode lines 12 and data lines 13 arranged on the substrate; and pixel electrodes 14 arranged at pixel unit regions defined by the gate lines 11 and the data line 13. Each of the gate lines 11 includes a gate electrode 111, and each of the data lines 13 includes a source electrode 131 and a drain electrode 132. The gate 111, the source 131 and the drain 132 constitute a thin film transistor.

The TFT array substrate may be of a bottom-gate structure or a top-gate structure.

For a TFT array substrate of the bottom-gate structure, a plurality of horizontal gate lines 11 is arranged on the substrate. A first insulating layer is arranged on the gate lines 11, and the first insulating layer includes a gate insulating layer and an active layer. A plurality of vertical data lines 13 is arranged on the first insulating layer. A second insulating layer is arranged on the data lines 13. A transparent electrode layer is arranged on the second insulating layer, the pixel electrodes 14 are arranged in the transparent electrode layer, and the pixel electrodes 14 are located in pixel unit regions defined by the gate lines 11 and the data lines 13. Further, the common electrode lines 12 and the gate lines 11 may be arranged at the same layer. Alternatively, the common electrode lines 12 may also be arranged between the gate lines 11 and the transparent electrode layer. For example, the common electrode lines 12 may be arranged between the gate lines 11 and the data lines 13, or arranged at a layer identical to the data lines 13, or arranged between the data lines 13 and the transparent electrode layer.

For a TFT array substrate of the top-gate structure, a transparent electrode layer is arranged on the substrate, and pixel electrodes 14 are arranged in the transparent electrode layer. A second insulating layer is arranged on the transparent electrode layer. The second insulating layer has A plurality of vertical data lines 13 is arranged on second insulating layer. A first insulating layer is arranged on the data lines 13, and the first insulating layer includes a gate insulating layer and an active layer. A plurality of is arranged on the horizontal gate lines 11. The pixel electrodes 14 are arranged at pixel unit regions defined by the gate lines 11 and the data lines 13. In addition, the common electrodes 12 are arranged at a layer above the data lines 13. For example, the common electrode lines 12 may be arranged between the data lines 13 and the gate lines 11, or may be arranged at a layer identical to the gate lines 11, or may be at a layer above the gate lines 11.

It should be noted that, in FIG. 2, the TFT array substrate of the bottom-gate structure is taken for illustrated purpose only, not intended to limit the present disclosure.

As shown in FIG. 2, the TFT array substrate further includes: a weld metal 15 electrically connected to the pixel electrodes 14. Projections of the weld metal 15 onto the substrate and projections of target wires onto the substrate are overlapped at overlapping regions, and the target wires are the gate lines 11 or the common electrode lines 12. In the TFT array substrate shown in FIG. 2, the following example is used that the projections the weld metal 15 onto a first metal layer and the gate lines 11 are overlapped at overlapping regions.

Since the pixel electrodes 14 and the weld metal 15 have already been electrically connected to each other, whereby when pixel light spots are maintained by a pixel spot darkening, for a display panel in the normally white mode, it is merely required to weld the weld metal 15 to the gate lines 11. For a display panel in the normally black mode, it is merely required to weld the weld metal 15 to the common electrode lines 12. As shown in FIG. 2, taking welding the weld metal 15 to the gate lines 11 as an example, a welding may be performed at a welding point 10 at the overlapping region by a laser welding, and metal materials of the weld metal 15 and the gate lines 11 will be melted and connected, so that the weld metal 15 is electrically connected to the gate lines 11. Compared with the related art in which metal is welded to ITO, metal materials are welded to each other when maintaining the TFT array substrate in some embodiments of the present embodiment, thereby effectively reducing the occurrence of ITO cracks.

For either the TFT array substrate of the bottom-gate structure or the TFT array substrate of the top-gate structure, the weld metal 15 may be arranged at a layer above the pixel electrodes 14, or may be arranged at a layer identical to the pixel electrodes 14, or may be arranged at a layer below the pixel electrodes 14, which is not limited herein. In some embodiments of the present disclosure, the gate lines 11 and the common electrode lines 12 are arranged in the same layer, and the weld metal 15 and the data lines 13 are arranged in the same layer, which may be advantageous to reduce the thickness of the TFT array substrate and meanwhile facilitate the manufacturing of the weld metal 15.

In addition, the weld metal 15 should not be too small or too large, the welding may be influenced adversely if the weld metal is too small, while the transparency of the TFT array substrate may be influenced adversely if the weld metal is too large. Thus, in some embodiments of the present disclosure, the length of the weld metal 15 is 6~18 µm, the width thereof is 3~5 µm, and the thickness thereof is 1~3 µm. Alternatively, the length of the weld metal 15 is 10 µm. In addition, in order to guarantee sufficient welding space, each of the overlapping regions where the projections of the weld metal 15 onto the substrate and the projections of the target wires onto the substrate are overlapped is 2~8 µm in width and 3~18 µm in length.

In addition, there are two possible ways to electrically connect the pixel electrodes 14 to the weld metal 15.

Figure 3:
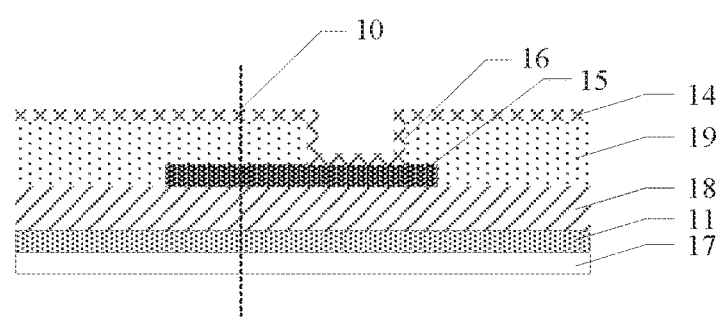
FIG. 3 is a sectional view of the TFT array substrate shown in FIG. 2 along the direction AA.

In a first connection way, the pixel electrodes 14 are electrically connected to the weld metal 15 through via holes 16. Alternatively, in conjunction with reference to FIG. 2 and FIG. 3, FIG. 3 is a sectional view of the TFT array substrate shown in FIG. 2 along the direction AA. A first metal layer is arranged on a substrate 17, and gate lines 11 are arranged on the first metal layer. A first insulating layer 18 is arranged on the first metal layer. A second metal layer is formed on the first insulating layer 18, and data lines 12 and the weld metal 15 are arranged on the second metal layer. A second insulating layer 19 is arranged on the second metal layer, and the via holes 16 are arranged at positions of the second insulating layer 19 corresponding to the weld metal 15. A transparent electrode layer is arranged on the second insulating layer 19, and the pixel electrodes 14 are arranged in the transparent electrode layer. The pixel electrodes 14 are electrically connected to the weld metal 15 through via holes 16.

Alternatively, the via holes 16 may be circular, square, or of other shapes. In order to ensure the stability of electrical connections between the pixel electrodes 14 and the weld metal 15 without adversely influencing the performance of the pixel electrodes 14, the via holes 16 should not be too small nor too large. For example, when a via hole 16 is circular, the diameter thereof is 6~15 µm, alternatively, the diameter thereof is 8 µm. For another example, when a via hole 16 is square, sides of the square hole are 6~15 µm in length, alternatively, sides of the square hole are 8 µm in length.

In a second connection way, the pixel electrodes 14 are directly lap jointed to the weld metal 15. For example, the weld metal 15 may be directly lap jointed to an edge of the pixel electrodes 14 on the upper surfaces thereof, also may be directly lap jointed to a lower edge of the pixel electrodes 14 on the lower surfaces thereof, or may be arranged at a layer identical to the pixel electrodes 14 and lap-jointed to the edges of the pixel electrodes 14.

Figure 4:
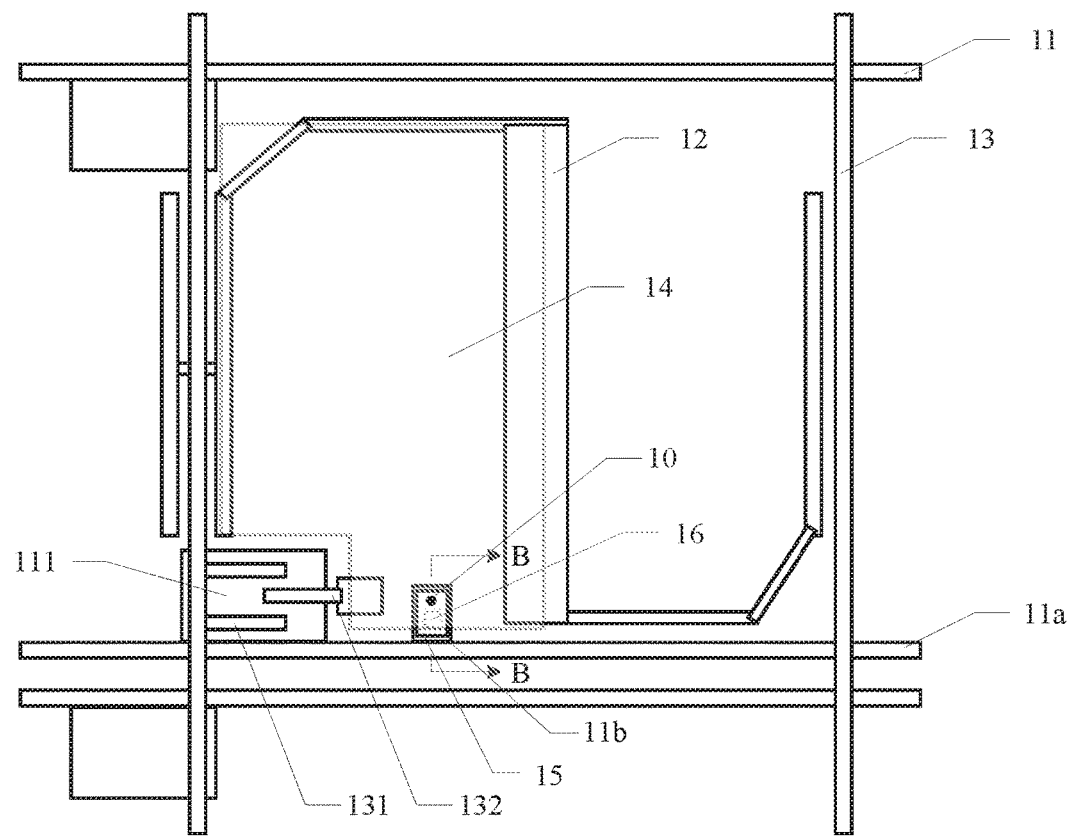
FIG. 4 is a schematic view of a TFT array substrate in some embodiments of the present disclosure.
Figure 5:
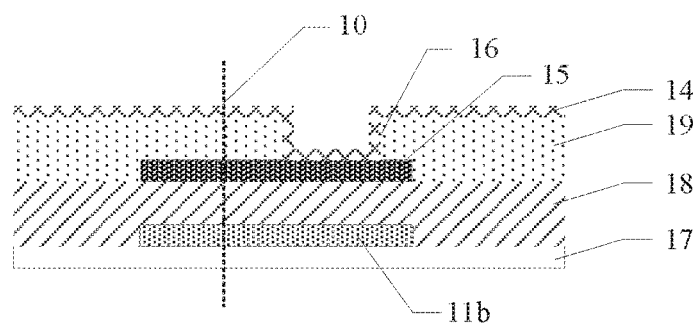
FIG. 5 is a sectional view of the TFT array substrate shown in FIG. 4 along the direction BB.

Further, since it is required to make the projections of the weld metal 15 onto the substrate overlapped with the projections of the target wires onto the substrate at the overlapping regions, so as to facilitate in welding the overlapping region during maintenance. Thus, when the width of the target wires is small and disadvantageous to the manufacturing of the overlapping region, each of the target wires includes a strip-like wire body and a welding portion electrically connected to the wire body. The projections of the weld metal 15 onto the substrate and the projections of the weld portions onto the substrate are overlapped at the overlapping regions. Referring to FIG. 4 and FIG. 5, FIG. 4 is a schematic view of a TFT array substrate in some embodiments of the present disclosure, and FIG. 5 is a cross-sectional view of the TFT array substrate shown in FIG. 4 along the direction BB. Taking that an the projections of the weld metal 15 onto the substrate and the projections of the gate lines 11 onto the substrate are overlapped at the overlapping regions as an example, each of the gate lines 11 includes a strip-like gate line body line 11 and a weld portion 11b electrically connected to the gate line body 11a, and the projections of the weld metal 15 onto the substrate and the projections of the weld portions 11b onto the substrate are overlapped at the overlapping regions.

In some embodiments of the present disclosure, a size of each of the welding portions may be similar to a size of the weld metal 15, and the weld portion is 6~18 μm in length and 3~5 μm in width.

Alternatively, in order to ensure that welding the overlapping region will not adversely influence the electrical connections already formed between the pixel electrodes 14 and the weld metal 15 during maintenance. All or part of each of the overlapping region is located outside a connection projection region, and the connection projection region is a projection region onto the substrate of a connection region in which each of the pixel electrodes 14 is electrically connected to the weld metal 15. For example, when the pixel electrodes 14 are electrically connected to the weld metal 15 through the via holes 16, all or part of each of the overlapping region 16 is located outside the projection region of the via hole onto the substrate. During the maintenance, the welding point 10 is arranged at a portion of the overlapping region outside the connection projection region. As shown in FIGS. 2 to 5, the welding point 10 is beside the via hole 16, without any overlapping with the via hole 16, so as to avoid damaging the electrical connections already formed between the pixel electrodes 14 and the weld metal 15 during the welding.

Figure 6:
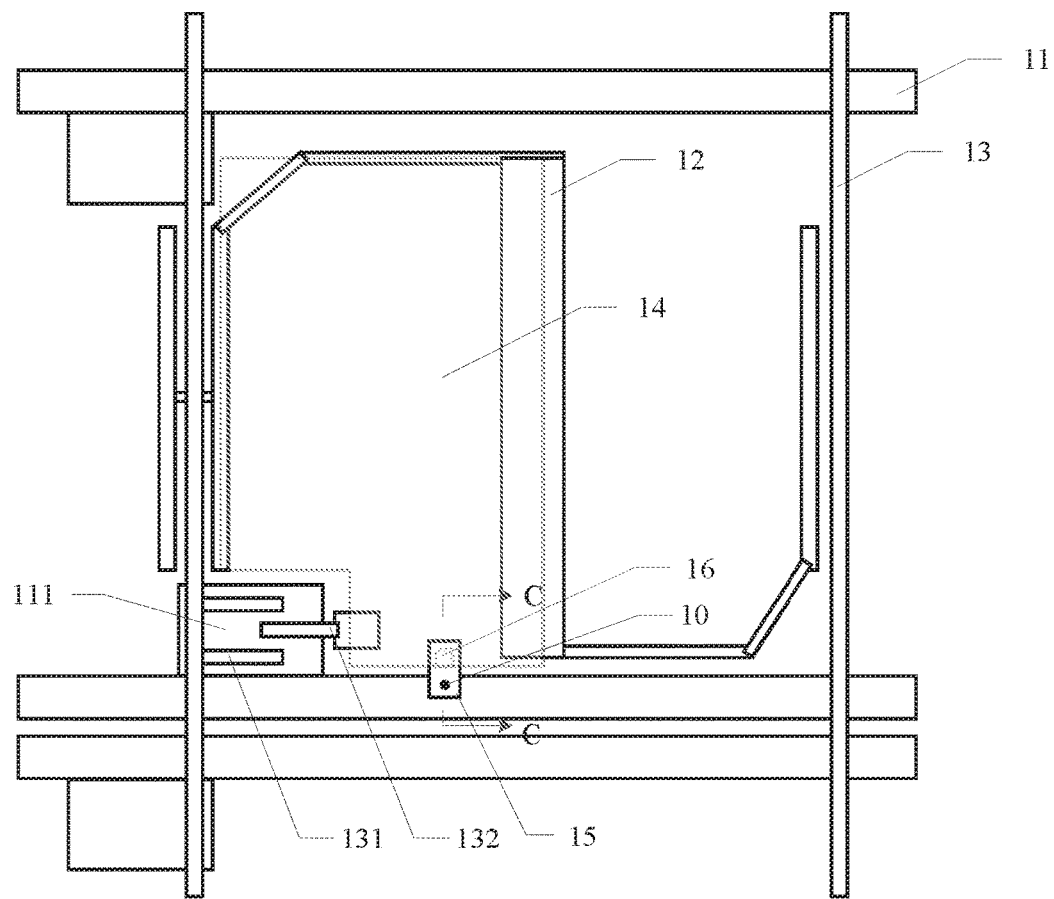
FIG. 6 is a schematic view of a TFT array substrate in some embodiments of the present disclosure.
Figure 7:
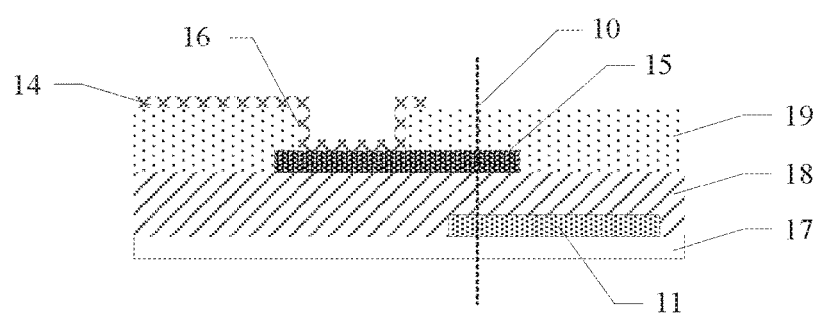
FIG. 7 is a sectional view of the TFT array substrate shown in FIG. 6 along the direction CC.

Further, referring to FIGS. 6 and 7, FIG. 6 is a schematic view of a TFT array substrate in some embodiments of the present disclosure, and FIG. 7 is a sectional view of the TFT array substrate shown in FIG. 6 along the direction CC. The projections of the weld metal 15 onto the substrate and the projections of the target wires onto the substrate are overlapped at the overlapping regions, and all or part of each of the overlapping regions is located outside the projection region of the corresponding pixel electrode 14 onto the substrate. As shown in FIGS. 6 and 7, taking that the projections of the weld metal 15 onto the substrate and the projections of the gate lines 11 onto the substrate are overlapped at the overlapping regions as an example, all or part of each of the overlapping regions is located outside the projection region of the corresponding pixel electrode 14 onto the substrate. During the maintenance, the welding point 10 is at a portion of the overlapping region outside the projection region of the corresponding pixel electrode 14 onto the substrate. As shown in FIGS. 6 and 7, the welding point 10 is beside to the pixel electrode 14, without any overlapping with the pixel electrode 14. Compared with the TFT array substrate as shown in FIG. 2 and FIG. 4, the TFT array substrate shown in FIG. 6 does not contact the pixel electrode 14 during welding maintenance, whereby the occurrence of ITO cracks may be avoided completely during welding.

In summary, according to the TFT array substrate in some embodiments of the present disclosure, the weld metal is electrically connected to pixel electrodes, and the projections of the weld metal onto the substrate and the projections of target wires onto the substrate are overlapped at overlapping regions. Thus, when pixel light spots are maintained by pixel spot darkening, the overlapping region is welded, so that electrical connections are formed between the weld metal and the target wires. The problem is addressed that, directly welding the pixel electrodes to the gate lines or the common electrode lines in the related art easily cause ITO cracks, resulting in a low welding success rate and a large probability of maintenance failure. Transforming the welding between metal and ITO to the welding between metal to metal is realized, effectively reducing the occurrence of ITO cracks, improving the welding success rate, and thus improving the maintenance success rate of TFT array substrate.

Also, by arranging the gate lines and the common electrode lines in the same layer, the weld metal and the data lines are formed in the same layer, which helps to reduce the thickness of the TFT array substrate while facilitating the manufacturing of the weld metal, thereby guaranteeing the productivity of the TFT array substrate.

In addition, when all or part of the overlapping region is located outside the connection projection region, the welding point is arranged at the overlapping region outside the connection projection region during maintenance, so as to avoid damaging the electrical connections already formed between the pixel electrodes and the weld metal and guarantee the maintenance success rate.

In addition, when all or part of the overlapping region is located outside the projection region of the pixel electrodes onto the substrate, during maintenance, the welding point is arranged at a portion of the overlapping region outside the projection region of the pixel electrodes onto the substrate, to ensure that the pixel electrodes do not be touched during welding maintenance, thereby completely avoiding the occurrence of ITO cracks during welding and further reducing the risk of maintenance failure.

The present disclosure further provides in some embodiments a display panel including the TFT array substrate provided in some embodiments of the present disclosure. In some embodiments, the display panel includes: a color film substrate, a TFT array substrate and a liquid crystal layer between the color film substrate and the TFT array substrate. The TFT array substrate may be the TFT array substrate shown in any one of FIG. 2, FIG. 4 or FIG. 6 provided in the above-described embodiments.

Alternatively, the display panel may be a product in a normally white mode, or may be a product in a normally black mode. For a display panel in the normally white mode, the projections the weld metal onto the substrate and the projections of the gate lines onto the substrate are overlapped at the overlapping regions. For a display panel in the normally black mode, the projections of the weld metal onto the substrate and the projections of the common electrode lines onto the substrate are overlapped at the overlapping regions.

The following is a method embodiment of the present disclosure, and for details not described in detail in the method embodiment, refer to the embodiment of the TFT array substrate.

The present disclosure further provides in some embodiments a method for manufacturing a TFT array substrate, and the manufacturing method may include the step of: forming on the substrate gate lines, common electrode lines, data lines, pixel electrodes and weld metal electrically connected to the pixel electrodes. The pixel electrodes are arranged at pixel unit regions defined by the gate lines and the data lines. Projections of the weld metal onto the substrate and projections of the target wires onto the substrate are overlapped at overlapping regions. The target wires are the gate lines or the common electrode lines.

In summary, according to the method of manufacturing the TFT array substrate in some embodiments of the present disclosure, a weld metal is electrically connected to pixel electrodes, and the projections of the weld metal onto the substrate and the projections of the target wires onto the substrate are overlapped at overlapping regions. Thus, when pixel light spots are maintained by pixel spot darkening, the overlapping region is welded, so that the electrical connections are formed between the weld metal and the target wires. The problem is addressed that, directly welding the pixel electrodes to the gate lines or the common electrode lines in the related art easily cause ITO cracks, resulting in a low welding success rate and a large probability of maintenance failure. Transforming the welding between metal and ITO to the welding between metal to metal is realized, effectively reducing the occurrence of ITO cracks, improving the welding success rate, and thus improving the maintenance success rate of TFT array substrate.

Figure 8:
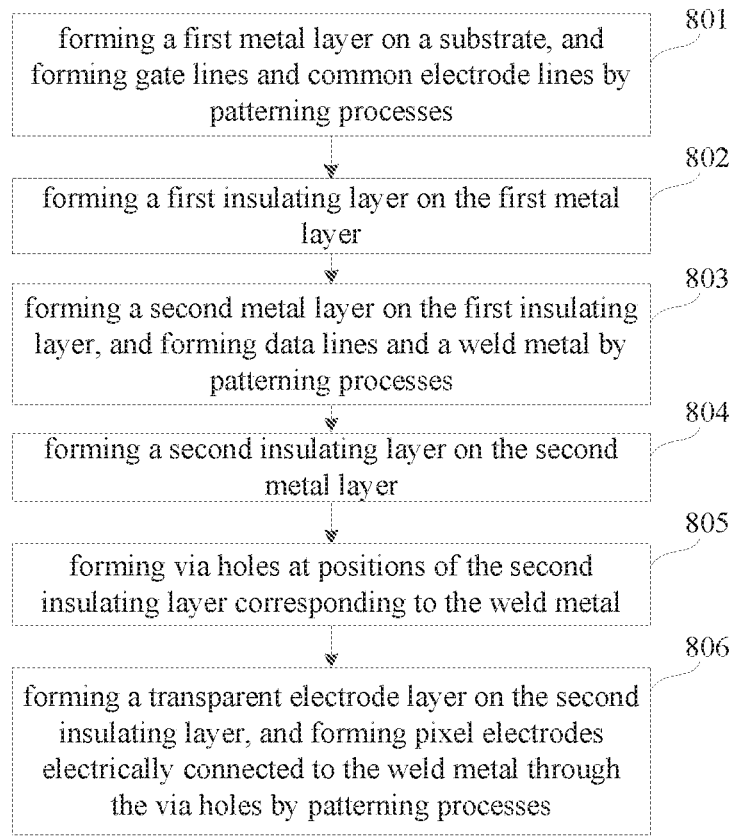
FIG. 8 is a flowchart of a method for manufacturing a TFT array substrate in some embodiments of the present disclosure.

Referring to FIG. 8, which is a flowchart of a method for manufacturing a TFT array substrate in some embodiments of the present disclosure. Taking a TFT array substrate of a bottom-gate structure as an example, the manufacturing method may include the following steps:

Step 801: forming a first metal layer on a substrate, and forming gate lines and common electrode lines by patterning processes.

Specifically, a magnetron sputtering method may be used to form the first metal layer on a substrate. The first metal layer may be made of molybdenum, aluminum, aluminum-nickel alloy, molybdenum tungsten alloy, chromium or copper and other metal, and also may have a film composition structure formed by the variety of metals abovementioned. Thereafter, a photo resist is coated onto the first metal layer, and a plurality of horizontal gate lines and a plurality of common electrode lines are formed on the substrate with a mask through patterning processes such as exposure, development, etching, peeling. Each of the gate lines includes a gate electrode Step 802: forming a first insulating layer on the first metal layer.

Specifically, the first insulating layer includes a gate insulating layer arranged on the first metal layer and an active layer arranged on the gate insulating layer. The gate insulating layer is generally made of silicon nitride, silicon oxide, silicon oxynitride or the like. The active layer is generally made of amorphous. The gate insulating layer and the active layer may be deposited onto the first metal layer in sequence by chemical vapor deposition.

Step 803: forming a second metal layer on the first insulating layer, and forming data lines and a weld metal by patterning processes.

In some embodiments of the present disclosure, the weld metal is formed in the second metal layer. That is, the weld metal and the data lines are located in the same layer. In addition, the projections of the weld metal onto the substrate and the projections of target wires onto the substrate are overlapped at the overlapping regions, and the target wires are the gate lines or the common electrode lines. The method of manufacturing the data lines and the weld metal is similar to the method of manufacturing the gate lines and the common electrode lines in step 801, and the detailed description is omitted herein. Each of the data lines includes a source electrode and a drain electrode.

Alternatively, the weld metal is 6~18 µm in length, 3~5 µm in width, and 1~3 µm in thickness.

Step 804: forming a second insulating layer on the second metal layer.

Specifically, the gate insulating layer is deposited onto the second metal layer by chemical vapor deposition, and the second insulating layer is typically made of silicon nitride or silicon dioxide.

Step 805: forming via holes at positions of the second insulating layer corresponding to the weld metal.

Alternatively, the via holes may be circular, square or other shapes. Alternatively, when a via hole is a circular hole, a diameter thereof is 6~15 µm; when a via hole is a square hole, the sides thereof are 6~15 µm in length.

Further, second via holes are further formed at positions on the second insulating layer corresponding to the drain electrodes.

Step 806: forming a transparent electrode layer on the second insulating layer, and forming pixel electrodes electrically connected to the weld metal through the via holes by patterning processes.

Specifically, the transparent electrode layer is formed on the second insulating layer by chemical vapor deposition, and pixel electrodes are eventually formed in pixel unit regions defined by the gate lines and the data lines with a mask by patterning processes. The pixel electrodes are usually made of ITO material. Of course, the material is not limited in the embodiments of the present disclosure, which may further be materials such as Indium Zinc Oxide (IZO).

The pixel electrodes are electrically connected to the weld metal through the via holes. Further, the pixel electrodes are electrically connected to the drain electrodes through second via holes.

It should be noted that, in some embodiments of the present embodiment, by example of that the gate lines and the common electrode lines are in the same layer and the weld metal and the data lines are in the same layer only, this will help to reduce the thickness of the TFT array substrate, facilitate the formation of the weld metal at the same time and ensure the productivity of the TFT array substrate. In some embodiments of the present disclosure, the common electrode lines may be located in the upper layer of the gate lines, and in the lower layer of the transparent electrode layer. For example, the common electrode lines may be located between the gate lines and the data lines, also may be located together with the data lines in the same layer, and also may be located between the data lines and the transparent electrode layer. The weld metal may be located in the upper layer of the pixel electrodes, also may be located together with the pixel electrodes in the same layer, and also may be located in the lower layer of the pixel electrodes. Further, in some embodiments of the present disclosure, by example of that the pixel electrodes are electrically connected with the weld metal through the via holes only, in other possible embodiments, the pixel electrodes also may lap directly the weld metal.

It further needs to be noted that, in some embodiments of the present disclosure, the sequence of fabrication of the various layers is described and explained only. For the position of the weld metal formed in the manufacturing process, the position of the overlapping region formed between the projection region of the weld metal on the substrate and the projection region of the target wires on the substrate, and the position of the connection region in which the pixel electrodes are electrically connected with the weld metal, refer to the introduction and description of embodiments of the TFT array substrate.

It further needs to be noted that, in some embodiments of the present disclosure, by example of a method of manufacturing the TFT array substrate of the bottom gate structure only, the manufacturing of a TFT array substrate of a top gate structure may use similarly reverse process flows, and this part of content is easily contemplated by those skilled in the art based on the content disclosed in the present embodiment, and will not be introduced and described in the present disclosure.

Figure 9:
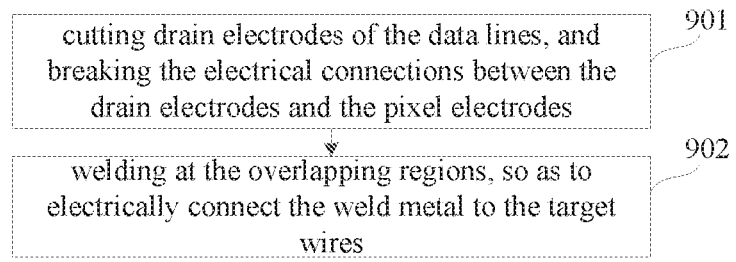
FIG. 9 is a flowchart of a method for maintaining a TFT array substrate in some embodiments of the present disclosure.

Referring to FIG. 9, which shows a flowchart of a method for maintaining a TFT array substrate in some embodiments of the present disclosure. The maintaining method can be used to maintain the TFT array substrate as shown in FIG. 2, 4 or 6 provided in the embodiments. The maintaining method may comprise the following steps:

Step 901: cutting drain electrodes of the data lines, and breaking the electrical connections between the drain electrodes and the pixel electrodes.

Step 902: welding at the overlapping regions, so as to electrically connect the weld metal to the target wires.

For TFT switch damage issues, pixel light spots are maintained in a pixel spot darkening way, to improve product yield. First, laser cutting technology can be used to cut the drains and break the electrical connections between the drains and the pixel electrodes. Then, since the electrical connections have already been formed between the pixel electrodes and the weld metal in the manufacturing of the TFT array substrate provided in some embodiments of the present disclosure, it is only required to weld at the weld point in the overlapping region using the laser welding technology, so that electrical connections are formed between the weld metal and the target wires.

Alternatively, in conjunction with reference to the TFT array substrate shown in FIG. 2 and FIG. 4, when all or part of the overlapping region is located outside the connection projection region, a region located outside the connection projection region in the overlapping region is welded, that is, the welding point is set in the overlapping region and located in a region located outside the connection projection region. Wherein the connecting projection region refers to the projection region of a connection region in which the pixel electrodes are electrically to the weld metal on the substrate. Thus, the electrical connections formed between the pixel electrodes and the weld metal can be prevented from being damaged during welding, to ensure the maintenance success rate.

Alternatively, referring to the TFT array substrate shown in FIG. 6, when all or part of the overlapping region is located outside the projection region of the pixel electrodes on the substrate, a region located outside the projection region of the pixel electrodes on the substrate in the overlapping region is welded, that is, the welding point is set in the overlapping region and located in a region outside the projection region of the pixel electrodes on the substrate. This can ensure that the pixel electrodes will not be touched during the maintenance welding, thereby completely avoiding the occurrence of ITO cracks during welding to further reduce the risk of maintenance failure.

In summary, according to the method for maintaining the TFT array substrate in some embodiments of the present disclosure, the welding are performed at the overlapping regions where the weld metal and the target wires are overlapped, so as to electrically connect the weld metal to the target wires. The problem is addressed that ITO cracks easily occur during directly welding the pixel electrodes with the gate lines or the common electrode lines in the related art, resulting in a low welding success rate and a large probability of maintenance failure. Transforming the welding between metal and ITO to the welding between metal materials is realized, effectively reducing the occurrence of ITO cracks, improving the welding success rate, and thus improving the maintenance success rate of TFT array substrate.

The serial numbers of some embodiments of the present disclosure are merely for illustrative purpose but do not represent advantages and disadvantages of the embodiments.

Those of ordinary skill in the art may appreciate that all or part of the steps implementing the above-described embodiments may be accomplished by hardware, and also may be accomplished by a program instructing relevant hardware. The program may be stored in a computer readable storage medium, which may be a read-only memory, a magnetic or optical disk, etc.

The foregoing is only for preferred embodiments of the present disclosure but is not intended to limit the disclosure. Modifications, improvements and equivalent replacements made without departing from the principle of the present disclosure shall also fall within the scope of the present disclosure.

What is claimed is:

1. A Thin Film Transistor (TFT) array substrate, comprising:
   a substrate; gate lines, common electrode lines, and data lines arranged on the substrate; and pixel electrodes arranged at pixel unit regions defined by the gate lines and the data lines;
   wherein the TFT array substrate further comprises weld metal electrically connected to the pixel electrodes, the weld metal directly contacts the pixel electrodes;
   orthographic projections of the weld metal independent from drain electrodes of TFTs onto the substrate and orthographic projections of the gate lines onto the substrate are overlapped at overlapping regions; and
   wherein an orthographic projection of a portion of the weld metal directly contacting the pixel electrodes onto the substrate partially overlaps orthographic projections of the gate lines onto the substrate.

2. The TFT array substrate according to claim 1, wherein the pixel electrodes are electrically connected to the weld metal through via holes.

3. The TFT array substrate according to claim 2, wherein the via holes are circular holes each being of a diameter in a range from 6 μm to 15 μm; or
   the via holes are square holes each being of a length of side in a range from 6 μm to 15 μm.

4. The TFT array substrate according to claim 1, wherein the pixel electrodes are directly lapped to the weld metal.

5. The TFT array substrate according to claim 1, wherein the weld metal and the data lines are arranged at the same layer.

6. The TFT array substrate according to claim 1, wherein each of the gate lines comprises a strip-like wire body and a weld portion electrically connected to the wire body;
   the projections of the weld metal onto the substrate and projections of the weld portions onto the substrate are overlapped at the overlapping regions.

7. The TFT array substrate according to claim 6, wherein the weld portion is of a length in a range from 6 μm to 18 μm and a width in a range from 3 μm to 5 μm.

8. The TFT array substrate according to claim 1, wherein all or a part of each of the overlapping regions is arranged outside a connection projection region;
   wherein the connection projection region is a projection region of a connection region, in which each of the pixel electrodes is electrically connected to the weld metal, onto the substrate.

9. The TFT array substrate according to claim 8, wherein a welding point at each of the overlapping regions is arranged at a portion of the overlapping region outside the corresponding connection projection region.

10. The TFT array substrate according to claim 1, wherein all or a part of each of the overlapping regions is arranged outside a projection region of the corresponding pixel electrode onto the substrate.

11. The TFT array substrate according to claim 1, wherein the weld metal is of a length in a range from 6 μm to 18 μm, a width in a range from 3 μm to 5 μm and a thickness in a range from 1 μm to 3 μm.

12. The TFT array substrate according to claim 10, wherein the welding point at each of the overlapping regions is arranged at a portion of the overlapping region outside the projection region of the corresponding pixel electrode onto the substrate.

13. The TFT array substrate according to claim 1, wherein the overlapping region is of a width in a range from 2 μm to 8 μm and a length in a range from 3 μm to 18 μm.

14. The TFT array substrate according to claim 1, wherein the gate lines and the common electrode lines are arranged at the same layer.

15. A display panel, including the TFT array substrate according to claim 1.

16. A method for maintaining the TFT array substrate according to claim 1, including:
cutting drain electrodes of the data lines, so as to break electrical connections between the drain electrodes and the pixel electrodes; and
welding at the overlapping regions, so as to electrically connect the weld metal to the gate lines.

17. The method according to claim 16, wherein the step of welding at the overlapping regions comprises:
welding at a portion of each of the overlapping regions outside the corresponding connection projection region;
wherein the connection projection region is a projection region of a connection region, in which each of the pixel electrodes is electrically connected to the weld metal, onto the substrate.

18. The method according to claim 16, wherein the step of welding at the overlapping regions comprises:
welding at a portion of each of the overlapping regions outside the projection region of the corresponding pixel electrode onto the substrate.

19. A method for manufacturing a Thin Film Transistor (TFT) array substrate, comprising:
forming, on a substrate, gate lines, common electrode lines, data lines, pixel electrodes, and weld metal electrically connected to the pixel electrodes, the weld metal directly contacts the pixel electrodes;
wherein the pixel electrodes are arranged at pixel unit regions defined by the gate lines and the data lines, orthographic projections of the weld metal independent from drain electrodes of TFTs onto the substrate and orthographic projections of the gate lines onto the substrate are overlapped at overlapping regions; and
wherein an orthographic projection of a portion of the weld metal directly contacting the pixel electrodes onto the substrate partially overlaps orthographic projections of the gate lines onto the substrate.

20. A Thin Film Transistor (TFT) array substrate, comprising:
a substrate;
gate lines, common electrode lines, and data lines arranged on the substrate;
pixel electrodes arranged at pixel unit regions defined by the gate lines and the data lines;
the TFT array substrate further including weld metal electrically connected to the pixel electrodes, with orthographic projections of the weld metal independent from drain electrodes of TFTs onto the substrate and orthographic projections of the gate lines onto the substrate overlapping at overlapping regions; and
wherein an orthographic projection of a portion of the weld metal directly contacting the pixel electrodes onto the substrate partially overlaps orthographic projections of the gate lines onto the substrate.

* * * * *